United States Patent

[11] 3,615,953

[72] Inventor Bryan H. Hill
Dayton, Ohio

[21] Appl. No. 784,344
[22] Filed Dec. 17, 1968
[45] Patented Oct. 26, 1971
[73] Assignee The United States of America as represented by the Secretary of the Air Force

[54] ETCH-RETARDING OXIDE FILMS AS A MASK FOR ETCHING
3 Claims, 3 Drawing Figs.

[52] U.S. Cl. .......... 156/17, 156/6, 117/93.3, 117/212, 204/157.1, 250/49.5, 156/13
[51] Int. Cl. .......... H01l 7/50, H05k 3/06
[50] Field of Search .......... 156/17; 204/157.1; 250/49.5; 117/93.3, 212

[56] References Cited
UNITED STATES PATENTS

| | | | |
|---|---|---|---|
| 3,296,359 | 1/1067 | Ramsey et al. | 174/68.5 |
| 3,360,398 | 12/1967 | Garibotti | 117/212 |
| 3,390,012 | 12/1968 | Haberecht | 117/12 |
| 3,272,670 | 9/1966 | Meyers | 156/17 |

*Primary Examiner*—Jacob B. Steinberg
*Attorneys*—Harry A. Herbert, Jr. and Alvin B. Peterson

ABSTRACT: A technique for making certain oxides resistant to etching compositions. Anodized and evaporated films of $Al_2O_3$ and anodized films of $Ta_2O_5$ have been found to become etch-retarding when subjected to an electron beam supplied, for example, by an electron microscope. Scanning of selected areas enables one to carry out etching processes used in the preparation of integrated circuits without resorting to lengthy conventional masking techniques.

INVENTOR.
BRYAN H. HILL
BY Harry A. Herbert Jr
ATTORNEY

ETCH-RETARDING OXIDE FILMS AS A MASK FOR ETCHING

BACKGROUND OF THE INVENTION

1. Field of the Invention

This invention is in the field of integrated circuit fabrication.

2. Description of the Prior Art

In the prior art, photolithographic processes are used to fabricate integrated circuits. These processes involve coating a wafer (semiconductor substrate covered with a thin oxide layer) with a uniform film of photosensitive emulsion. The photosensitive emulsion material is soluble in certain liquids unless it is polymerized. After the film is applied, a photographic mask is placed over it. The mask allows one to polymerize selected areas of the film by exposing them to ultraviolet light. After selected areas of the film are polymerized, the unpolymerized film is removed by solvation leaving selected areas of the oxide layer coated with a polymer and leaving other areas uncoated. The polymer coated areas are resistant to etching materials. Etching materials can then be employed to remove the oxide layer in areas which have not been protected by the polymer.

The photolithographic processes have been found cumbersome, complicated and time consuming.

This invention discloses a method whereby etching of selected areas of certain oxides may be easily and quickly carried out without going through all of the complicated, time consuming operations of the conventional photolithographic processes.

SUMMARY OF THE INVENTION

This specification describes a technique which may be used to open discretionary holes or patterns in oxides the use of conventional photolithographic processes. The oxides of this disclosure may be described as electron-sensitive, etch-retarding oxides. An electron-sensitive, etch-retarding oxide is one which exhibits retardation in chemical etch rate in those areas which have been irradiated with an electron beam. Aluminum oxide and tantalum oxide were studied and it is contemplated that there are many other oxides which would be equally suitable.

The process of this invention involves irradiating selected areas of the oxide film with an electron beam from an electron microscope. The irradiated areas become etch-retarding. Thus, the areas not irradiated may be etched by conventional etching materials without completely removing the areas which have been irradiated. On the other hand, the irradiated, etch-retarding areas are not completely etch-resistant. Thus, if for some reason one wishes to etch away the irradiated areas at a later time one may do so by a more vigorous application of the etching material.

DESCRIPTION OF THE PREFERRED EMBODIMENT

Figure 1:
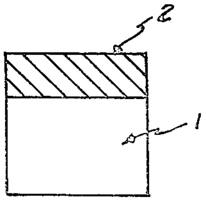
FIG. 1 is a cross-sectional view of a semiconductor material wafer having a thin film of oxide.

To clearly understand the invention, reference may be had to the accompanying drawing. FIG. 1 shows a cross section of a wafer made from a semiconductor material 1 having a thin oxide layer 2. The semiconductor material may be selected from a wide variety of materials such as Si, Ge, GaAs, CdS, InSb, and many more. The oxides of this invention are anodized and evaporated films of $Al_2O_3$ and anodized films of $Ta_2O_5$. It is believed that many other oxides will exhibit the etch-retarding effect.

Figure 2:
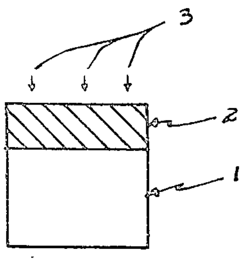
FIG. 2 is a cross-sectional view of the wafer being irradiated.

FIG. 2 shows the wafer of FIG. 1 being irradiated with electron beams 3. The irradiation is carried out with a scanning electron beam having beam energies in the 15 to 20 kv. range and beam currents in the $10^{16}$ to $10^{17}$ ampere range. The oxides studied were on the order of 2500 to 8000 Angstroms thick and reached saturation between 1.5 and 2.5 coulombs per square centimeter. That is, charge saturation beyond 1.5 to 2.5 C/cm.$^2$ did not give further retardation effects. The range, current and charge saturation of this disclosure exhibited no deleterious effect on the underlying semiconductor substrates.

Figure 3:
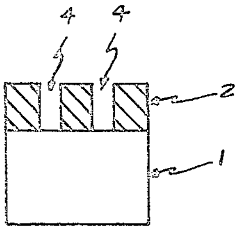
FIG. 3 is a cross-sectional view of the wafer after etching operations have been carried out.

After selected areas are irradiated with the electron beam, the oxides may be etched with conventional etching materials. FIG. 3 shows the wafer, which has been irradiated in FIG. 2, with openings 4 produced by chemical etching.

The following are specific examples of operations carried out in the perfection of this invention. The specific disclosure of $Al_2O_3$ and $Ta_2O_5$ as the oxide films in the examples should not be construed as limiting the invention. The method of this invention will obviously work with any oxide that is an electron-sensitive, etch-retarding oxide as defined above.

EXAMPLE I

An $Al_2O_3$ film having a thickness on the order of 6000 Angstroms was placed on a silicon wafer by evaporation deposition. The film was irradiated for 20 minutes in selected areas with an electron beam having beam energies and beam currents described above. After irradiation, the filmed wafer was subjected to an etching composition of 85 percent $H_3PO_4$ at a temperature of 70° C. The areas of the film which had been irradiated exhibited etch-retardation and the areas which were not irradiated were etched away.

EXAMPLE II

Films of $Al_2O_3$ having thicknesses ranging from 3500 to 7000 Angstroms were evaporation deposited on to microscope slides and irradiated and etched as in example I. The irradiated areas again exhibited etch-retardation and the areas which were not irradiated did not.

EXAMPLE III

A film of aluminum was sputtered on to a microscope slide and anodized to $Al_2O_3$. Irradiation and etching was carried out in the manner of examples I and II with the same results

EXAMPLE IV

Tantalum was sputtered on to several microscope slides and anodized to $Ta_2O_5$. The films had a thickness ranging from about 2500 Angstroms to about 8000 Angstroms. Irradiation was carried out as described in previous examples. Etching was carried out at room temperature with a solution prepared from 200 cc of 48 percent HF, 20 cc of deionized water and 80 grams of $NH_4F$. Irradiation and etching of $Ta_2O_5$ gave the same results as irradiation and etching of $Al_2O_3$.

EXAMPLE V

Wafers were prepared from Si. Films of $Al_2O_3$ ranging from about 3500 to 7000 Angstroms in thickness were applied either by evaporation or anodization techniques and selected areas irradiated as described in the previous examples. Etching materials had very little effect on the irradiated areas and the semiconductor substrate was not affected by the irradiation.

It will be obvious to one skilled in the art that many other semiconductor materials could be substituted for the ones disclosed in this specification. It will also be obvious that oxide films prepared from the metals of groups III, IV and V are all likely candidates for the irradiation and etching techniques described in this specification.

This specification discloses a scanning electron microscope as the source of the electron beam. Any source of electrons having beam energies and currents in the range disclosed above would work equally well. Only enough beam energy is needed to penetrate the oxide film. Too much could conceivably have harmful effects on the semiconductor substrate. However, if harm to the substrate occurs it can be repaired by annealing.

The time required for irradiation is directly proportional to the area being irradiated and is inversely proportional to beam current. Areas irradiated in all the above examples were on the order of one to a few square microns in size and all required about 20 minutes of irradiation. Beam energies of 15 to 20 kv. were sufficient to penetrate the thicknesses disclosed in the above examples.

It should be emphasized again that the oxides of this invention become etch-retarding and not completely etch-resistant when irradiated and that the irradiated areas are not completely irremovable. Thus, if it is desirable, the irradiated areas may still be removed at a later time in integrated circuit preparation.

We claim:

1. The method of etching metallic oxides selected from the group consisting of $Ta_2O_5$ and $Al_2O_3$ films to form a desired pattern comprising irradiating said films for about 20 minutes with an electron beam having a beam energy of about 15 to about 20 kv. and a beam current of about $10^{16}$ to about $10^{17}$ amperes.

2. The method of claim 1 wherein the $Al_2O_3$ film has a thickness of about 3500 to about 7000 Angstroms.

3. The method of claim 1 wherein the $Ta_2O_5$ film has a thickness of about 2500 to about 8000 Angstroms.

* * * * *